United States Patent [19]

Fujimura et al.

[11] Patent Number: 5,002,807
[45] Date of Patent: Mar. 26, 1991

[54] SILICONE COMPOSITION FOR IMPREGNATING ELECTRIC PARTS

[75] Inventors: Yoshio Fujimura, Annaka; Tetsuo Yoshida, Takasaki; Minoru Takei, Usui, all of Japan

[73] Assignee: Shin-Etsu Chemical Co., Ltd., Tokyo, Japan

[21] Appl. No.: 453,199

[22] Filed: Dec. 26, 1989

Related U.S. Application Data

[63] Continuation of Ser. No. 232,849, Aug. 16, 1988, abandoned.

[30] Foreign Application Priority Data

Aug. 19, 1987 [JP] Japan ................................ 62-205888

[51] Int. Cl.$^5$ .............................................. B05D 3/02
[52] U.S. Cl. ........................................ 427/387; 528/24
[58] Field of Search ........................... 528/24; 427/387

[56] References Cited

U.S. PATENT DOCUMENTS

| | | | |
|---|---|---|---|
| 3,892,707 | 7/1975 | Itoh et al. | 524/862 |
| 4,339,564 | 7/1982 | Okamura | 524/24 |
| 4,451,634 | 5/1984 | Hatanaka et al. | 528/24 |
| 4,463,127 | 7/1984 | Alberts et al. | 528/24 |
| 4,487,906 | 12/1984 | Kniege et al. | 528/15 |
| 4,539,357 | 9/1985 | Bobear | 528/24 |
| 4,777,063 | 10/1988 | Dubrow et al. | 528/24 |

*Primary Examiner*—Melvyn I. Marquis
*Attorney, Agent, or Firm*—Birch, Stewart, Kolasch & Birch

[57] ABSTRACT

A silicone composition adapted for impregnation of electronic parts comprising a vinyl group-containing organopolysiloxane, an organopolysiloxane having at least two hydrogen atoms bonded to silicon atoms in one molecule and a peroxide compound. The peroxide compound is soluble in both organopolysiloxanes and is contained in an amount of from 0.1 to 10 parts by weight per 100 parts by weight of the total of the organopolysiloxanes. The composition has a viscosity which is sufficient to allow easy impregnation, and is in the range of from 20 to 400 centistokes at 25° C.

11 Claims, No Drawings

SILICONE COMPOSITION FOR IMPREGNATING ELECTRIC PARTS

This application is a continuation of application Ser. No. 07/232,849 filed on Aug. 16, 1988, now abandoned.

BACKGROUND OF THE INVENTION

1. Field of the Invention

This invention relates to a silicone composition which is useful as an impregnating agent for electronic parts and has good moisture proofing and good adhesiveness to adhesives.

2. Description of the Prior Art

It is the usual practice to encapsulate or package electronic parts, such as transistors, diodes, resistors, capacitors, ceramic-dusted capacitors and the like, with epoxy resin compositions. In general, there are formed very small gaps or voids between the encapsulating resin and the electronic parts being encapsulated.

The presence of the gaps or voids may lead to deterioration of the characteristics of the electronic parts because impurities such as water, $Cl^-$, $Na^+$ and the like which will cause the characteristics of the electronic parts to deteriorate can enter from the outside through the gaps or voids.

For the purpose of filling the gaps or voids, natural waxes such as carnauba wax or silicone oils have been conventionally used. Especially, silicone oil has been widely employed because the oil has such a low surface tension that it can readily enter small gaps, and contains only reduced amounts of impurities such as $Cl^-$, $Na^+$ and the like. In addition, the silicone oil has good heat resistance.

In recent years, attachment of electronic parts to a printed circuit board has been often made by the following procedure so as to improve the productivity there of. Electronic parts are preliminarily adhered to a printed circuit board with an adhesive, followed by immersion in a solder bath to fix the electronic parts onto the printed circuit board. When known silicone oils are employed, gaps or voids involved in electronic parts can be filled but a slight silicone film is formed on the surface of the parts. Consequently, the adhesion between the silicone film and the adhesive is poor, which results in the adhesive not adhering to the electornic parts, thus presenting the problem that the electronic parts cannot be mounted on the printed circuit board.

Since silicone impregnating agents or oils can fill the defective parts of electronic parts and can improve a moisture proofing characteristic, they have been frequently used to treat transistors or IC having metal leads. When, however, there are used as the silicone impregnating agent those of the curing type comprising, for example, organohydrogenpolysiloxanes and vinyl group-containing organopolysiloxanes for the treatment of electronic parts, a silicone film is formed on the surfaces of the electronic parts or on the metal leads thereof. The formation of the silicone film tends to adversely influence the printability on the surfaces of the electronic parts or the solderability of the metal lead to a substantial extent. Accordingly, for the soldering or printing operations of the electronic parts treated with such a silicone impregnating agent it has been necessary to remove the silicone film deposited on the lead portions or the surfaces of the electronic parts with a solvent or by blasting. This creates a complicated operation procedure for assembling electronic parts, which in turn places a limitation on the use or application of the electronic parts. To avoid this problem, a non-curing type of silicone impregnating agent has been used. If this type of agent is used, it is easy to remove the silicone deposits from the lead portions or the surfaces of electronic parts. However, when the impregnated electronic parts with the silicone are allowed to stand under high temperature and high humidity conditions over a long period of time, the silicone is gradually deluted, thus producing a problem of deterioration of the electric characteristics.

As will become apparent from the above, known impregnating agents are not satisfactory since they are disadvantageous in that the electronic parts treated therewith are poor in working properties or the agents are not high in moisture proofing. These agents are not favorable as an impregnating agent for recent electronic parts. Accordingly, there is s demand of the development of a novel impregnating agent.

SUMMARY OF THE INVENTION

It is an object of the present invention to provide an impregnating agent for electronic parts which allows good printability on the surface of the impregnated electronic parts and solderability of the lead portions there of in a satisfactory manner.

It is another object of the present invention to provide an impregnating agent for electronic parts which exhibits good working properties and is able to yield impregnated electronic parts imparted with good electric characteristics and good water proofing.

It is a further object of the present invention to provide an impregnating agent which is able to fill gaps or voids of electronic parts.

The above objects can be achieved, according to the present invention, by a silicone composition which comprises:

(A) a vinyl group-containing organopolysiloxane;
(B) an organopolysiloxane having at least two hydrogen atoms bonded to silicon atoms in one molecule; and
(C) a peroxide compound which is soluble in both organopolysiloxane (A) and (B), and is present in an amount of from 0.1 to 10 parts by weight per 100 parts by weight of (A) and (B), the silicone composition having a viscosity of from 20 to 400 centistokes at 25° C.

This silicone composition can be readily impregnated into the gaps or voids of electronic parts and can be satisfactorily cured in situ after the impregnation, thereby imparting to the impregnated parts good heat resistance, moisture proofing and electric characteristics. Thus, the electronic parts can be completely packaged or encapsulated. On the other hand, the composition deposited on the surfaces of electronic parts and the lead portions remains uncured, so that it can be readily washed away. Thus, the drawbacks involved in the known curing types of silicone impregnating agents, i.e. the deposition of the agent on the surfaces of electronic parts which would render the surfaces to be incapable of being soldered, the formation of a silicone film on the surfaces of electronic parts lowers adhesiveness thereof to an adhesive and the like, can be fully overcome.

The present invention is based on the finding that when vinyl group-containing organopolysiloxanes are thermally cured by the use of a peroxide catalyst in air, the activity of the peroxide compound is suppressed by the presence of oxygen in the air. Thus, the composition is rarely cured or hardened. On the other hand, when no or little oxygen is present, the curing reaction fully proceeds.

When a composition comprised of a vinyl group-containing organopolysiloxane and a peroxide compound is used to impregnate electronic parts, the composition which enters the gaps or voids of the electronic parts is rarely brought into contact with oxygen in the air and is more likely to be cured. On the other hand, the composition that is on the outer surfaces of the electronic part or lead portions is in contact with oxygen and said composition thereof is suppressed from curing and thus remain substantially uncured. In this condition, when the impregnated electronic part is immersed in a solvent capable of dissolving the silicone compound, e.g. toluene, trichloroethylene, acetone, dimethylformamide, methanol and the like, the composition in the gaps or voids of the electronic part which has been cured, does not become dissolved out. In contrast, the silicone film that is not cured and which is on the outer surface or the lead portion, is readily dissolved and can be washed away.

In this connection, however, the above composition essentially consisting of the vinyl group-containing organopolysiloxane and the peroxide takes a relatively long period of time to cure and accordingly, the operating properties are poor. If the amount of the peroxide is increased, the curing can be facilitated but the electric characteristics of the cured product would be lowered. The present inventors have found that to expediting the curing of the composition to essentially consisting of the vinyl group-containing organopolysiloxane while still using only a small amount of the peroxide, can be effected by the addition of an organopolysiloxane having hydrogen atoms bonded to silicone atoms. The addition of such an organopolysiloxane can remarkably shorten the curing time without sacrificing the characteristics which are inherent to the composition composed of the vinyl group-containing organopolysiloxane and the peroxide compound. Thus from a practical standpoint this composition which comprises the three ingredients has been found to be excellent as a composition for impregnating electronic parts.

DETAILED DESCRIPTION OF THE INVENTION

The vinyl group-containing organopolysiloxane (A) which is the first essential ingredient of the composition of the present invention may be any organopolysiloxanes, provided that these organopolysiloxanes have at least two vinyl groups in one molecule which are positioned at the ends of or are attached as side chains to the individual organopolysiloxane. As the organopolysiloxane (A), preferred are those represented by the formula below:

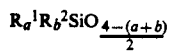

wherein $R^1$ denotes an unsubstituted or substituted monovalent hydrocarbon group having 1 to 10 carbon atoms, $R^2$ denotes an alkenyl group having 2 to 5 carbon atoms, $0<a<2$, $0<b<2$ and $1.8 \leq a+b \leq 2.2$. The organopolysiloxane (A) should have at least two vinyl groups as described above. $R^1$ does not contain any unsaturated aliphatic groups. Examples of $R^1$ are an alkyl group such as a methyl group, an ethyl group, a propyl group and the like, an aralkyl group, and an aryl group such as a phenyl group, a tolyl group and the like. Especially preferred are organopolysiloxanes having an organopolysiloxane main chain and both a methyl group and a phenyl group as side chains. Examples of the organopolysiloxanes include a homopolymer consisting of methylphenylsiloxane units, copolymers of dimethylsiloxane units and methylphenylsiloxane units, copolymers of dimethylsiloxane units and diphenylsiloxane units, and the like. These organopolysiloxanes should generally be linear in nature, but may have a small amount of branching.

The vinyl group-containing organopolysiloxane should preferably have a viscosity of from 20 to 400 centistokes, more preferably from 20 to 150 centistokes, at 25° C. If the viscosity is less than 20 centistokes, the resultant composition is likely to vaporize after curing. Over 400 centistokes, the composition may not readily impregnate into electronic parts.

The content of Na and Cl ions in the vinyl group-containing organopolysiloxane may not be greater than 10 ppm, preferably not be greater than 2 ppm. When the content of Na and Cl ions is greater than 10 ppm, the characteristics of electronic parts impregnated with the silicone composition may deteriorate.

The second essential ingredient of the composition of the present invention is organopolysiloxane (B) which has at least two hydrogen atom bonded to silicon atoms in one molecule. The preferred organopolysiloxane (B) is represented by the following formula:

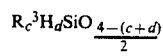

wherein $R^3$ has the same meaning as $R^1$ defined above, $0<c<2$, $0<d<3$ and $1<c+d<3$. The organopolysiloxane (B) is not critical and includes a variety of methylhydrogenpolysiloxanes. Examples of such organopolysiloxanes include methylhydrogenpolysiloxanes blocked with a trimethylsilyl group at both ends, dimethylsiloxane-methylhydrogenpolysiloxane copolymers blocked with a trimethylsilyl group at both ends, methylhydrogenpolysiloxanes blocked with a dimethylhydrogensilyl group at both ends, dimethylsiloxane-methylhydrogensiloxane copolymers blocked with a dimethylhydrogensilyl group at both ends, tetramethyltetrahydrogencyclotetrasiloxane, pentamethyltrihydrogencyclotetrasiloxane, tri(dimethylhydrogensiloxy)-methylsilane, and the like. The ingredient may have a linear, branched, cyclic or crosslinked molecular structure.

The second organopolysiloxane ingredient should preferably have a viscosity of from 1 to 500 centistokes, preferably from 1 to 100 centistokes. With a viscosity less than 1 centistoke, the resultant composition is likely to vaporize. Over 500 centistokes, the composition may not readily impregnate.

The content of Na and Cl ions in the second organopolysiloxane ingredient should preferably be not greater than 10 ppm, more preferably not greater than 2 ppm. Over 10 ppm, the characteristics of electronic parts impregnated with the silicone composition is likely to deteriorate.

In the practice of the present invention, the amount of the second ingredient (B) is in the range of from 5 to 100 parts by weight, preferably from 5 to 50 parts by weight, per 100 parts by weight of the first ingredient (A). If the amount is less than 5 parts by weight, the curing acceleration effect of the second ingredient may not be satisfactorily. Over 50 parts by weight, the cured composition may become brittle and become characterized with poor moisture proofing.

The third essential ingredient is peroxide compound (C).

The peroxide compound serves as a curing catalyst and should be soluble in silicone compounds (A) and (B). Preferably, the peroxide compound should have a solubility of 1 g or over in 100 g of a dimethylsilicone oil having a viscosity of 100 centistokes. When peroxide compounds having a solubility of less than 1 g in the above dimethylsilicone oil are used, the capability of impregnation or curability of the composition may become poor.

Examples of the peroxide compound are those indicated in the following formulae (1) to (10)

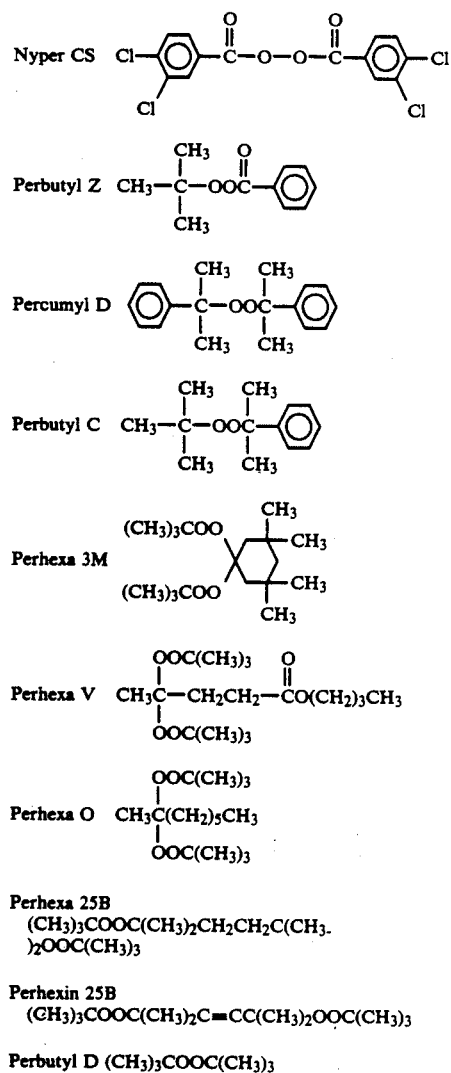

The content of Na and Cl ions in the peroxide compound should preferably not be greater than 100 ppm. Over 100 ppm, the characteristics of the electronic parts impregnated with the resultant composition may deteriorate.

The amount of the peroxide compound is in the range of from 0.1 to 10 parts by weight, preferably from 0.1 to 5 parts by weight, per 100 parts by weight of the total of first and second ingredients (A) and (B). If the amount is less than 0.1 parts by weight, the curability of the resultant composition deteriorates. Over 10 parts by weight, the moisture proofing after treatment with such a composition becomes poor.

The silicone composition of the present invention comprises first to third ingredients, (A) to (C) as described above and should have a viscosity of from 20 to 400 centistokes, preferably from 20 to 150 centistokes, at 25° C. Preferably, the content of Na and Cl ions should be not be greater than 10 ppm, more preferably not greater than 2 ppm in total. For attaining the defined range of viscosity and the defined ion content, the types, viscosity and purity of the respective ingredients should properly be controlled. If the viscosity of the composition is less than 20 centistokes, it is likely to vaporize during the impregnating and curing stages. Over 400 centistokes. The capability of impregnation becomes very poor, the content of Na and Cl ions over 10 ppm may lead to deterioration of characteristics of electronic parts.

The composition of the present invention is preferably prepared in such a way that the content, of solid impurities having a size not smaller than 5 micrometers, is 1 mg/100 g or less. Over 1 mg, it may become difficult to permit the composition to be impregnated into the fine interstices of the electronic parts. These solid impurities may be incorporated in small amounts when the first, second and third essential ingredients are separately prepared, or these ingredients are mixed to obtain a composition. The composition in which the solid impurities have been incorporated may be treated by various methods of eliminating the solid impurities therefrom. In the practice of the present invention, the composition is favorably passed through a milli-pore filter having a gas size of from 8 to 0.1 micrometer to eliminate the solid impurities.

The silicone composition may further comprise other ingredients such as various surface active agents for the purpose of obtaining a smooth film after impregnation, e.g. polyoxyethyleneglycol-dimethylsiloxane, fluorinated alkyl surface active agents and the like, colloidal silica having a particle size of less than 5 micrometers in amounts which do not lower the viscosity of the composition, and the like.

The silicone compositions of the present invention have wide utility. They can be used for impregnating electronic parts such as transistors, diodes, resistors, capacitors, ICs and the like. The composition may be impregnated in electronic parts by any suitable methods. Such methods include, for example, a pressure impregnation method, a vacuum impregnation method, a normal pressure impregnation method, a surface coating method and the like. The vacuum impregnation method described below is particularly preferred in view of the good characteristics of the impregnated electronic parts.

Vacuum Impregnation Method (1) A part to be impregnated is placed in a container, to which an impregnating agent is added to such an extent that the part is completely immersed.

(2) The container is placed in an apparatus which can be evacuated, followed by reducing the pressure of the entire system, whereupon bubbles are generated on the surface of the part. The bubbles are initially caused from the entire surface, after which they continue to form only from the gaps or voids of the part. The degree of the reduced pressure should preferably be as high as possible and is generally in the range of from 20 to 50 mmHg.

(3) The system is returned to a normal pressure when the formation of bubbles has ended or almost ended.

(4) The part is removed from the impregnating solution, and the solution is fully removed therefrom. This is followed by the immersion of the impregnated part in a solvent such as trichloroethylene, toluene, acetone or the like, so as to remove the impregnating agent from the surface of the part.

(5) After removal from the solvent, if necessary, the remaining solvent is allowed to evaporate fully and the part is heated and dried if necessary.

(6) Curing is carried out at a given temperature.

(7) The part is immersed again in a solvent such as trichloroethylene, toluene, acetone or the like so as to completely remove the impregnating agent from the surface of the part.

The silicone composition of the present invention is, after being impregnated in the electronic parts, cured under conditions of from 150° to 180° C. for 1 to 4 hours.

The silicone composition of the present invention has a high capability to impregnate in gaps or voids of electronic parts and to characterize the parts with good heat resistance. In addition, the composition has a high curability under certain conditions and ensures good printability on the surface part and has good adhesiveness to adhesives. The treated part has good electric characteristics and moisture proofing and is thus high in quality.

The present invention is described in more detail by way of examples, which should not be construed as limiting the invention. Comparative examples are also shown.

[EXAMPLE 1]

95 g of dimethylvinylpolysiloxane of the following structural formula (11) having a viscosity of 100 centistokes, a Na+ content of 1 ppm and a Cl− content of 1 ppm,

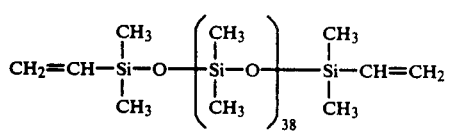
(11)

and 5 g of a Si—H group-containing dimethylpolysiloxane of the following structural formula (12) having a viscosity of 100 centistokes with a Na+ content of 1 ppm and a Cl− content of 0.5 ppm

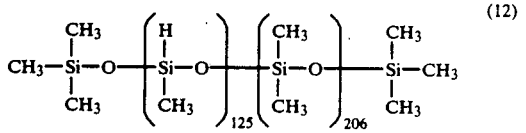
(12)

were placed in a separable flask and agitated at room temperature for 2 hours, followed by further addition of 0.5 g of t-butyl cumyl peroxide and agitation for further 2 hours. The resultant mixed composition was passed through a millipore filter with a mesh size of 0.8 micrometers.

The composition had a viscosity of 100 centistokes with a Na+ content of 1 ppm and a Cl− content of 1 ppm and a solid impurity content of 0.02 mg/100 g.

Thereafter, the composition was used for impregnation of IC.

The above composition and 1000 pieces of 14-pin ICs molded with an epoxy resin were placed in a container of a vacuum impregnation apparatus, followed by reducing the pressure and continuing vacuum impregnation until the bubbles disappeared completely. The degree of the reduced pressure was 20 mmHg. After allowing to stand over 3 hours under this reduced pressure, the system was returned to a normal pressure and 1000 pieces of ICs were removed from the container. The removed ICs were cured at 150° C. for 2 hours and repeatedly washed with toluene 2 or 3 times.

The printability and solderability of the impregnated ICs, and a corrosion resistance of aluminum wires were tested by the following methods.

Printability

Markem 7224 (Markem Co., Ltd.) was used to print on the surface of 1000 pieces of 14-pin ICs.

After printing, the number of ICs which had been found to repel the ink was checked, from which a percent defective per 1000 ICs was determined.

Solderability

After immersion of 1000 pieces of ICs into a solder bath at 260° C., the ICs were removed and used to check the state of deposition of the solder on the leads of the ICs. The number of ICs whose leads were not deposited with the solder were checked to determine a percent defective.

Al wire corrosion resistance 100 pieces of 14-pin ICs each having an Al wiring were allowed to stand at 121° C. under a pressure of 2.1 atm., for 500 hours.

Afterwards, the breakage of the Al wiring was checked to determine the number of the ICs in which the Al wiring was broken and expressed as a percent defective.

The results of the tests reveal that the impregnated ICs have a percent defective of the printability of 0% and a percent defective of the solderability of 0%. Moreover, the percent defective of the Al wire corrosion was 0% after 500 hours.

[COMPARATIVE EXAMPLE 1]

95 g of dimethylvinylpolysiloxane of the formula (11) having a viscosity of 100 centistokes wit a Na+ content of 1 ppm and a Cl− content of 1 ppm and 5 g of Si-H group-containing dimethylpolysiloxane of the formula (12) were placed in a separable flask and agitated at room temperature for 2 hours, after which 0.02 g of a chloroplatinic acid solution having a Pt content of 3% was added and agitated for further 2 hours. The resultant mixture composition was passed through a millipore filter with a mesh size of 0.8 micrometers.

The composition has a viscosity of 120 centistokes with a Na+ content of 0.8 ppm and a Cl− content of 1.8 ppm and a solid impurity content of 0.4 mg/100 g.

The composition was used for impregnation of 1000 pieces of 14-pin ICs molded with an epoxy resin similar to Example 1.

The thus impregnated ICs were subjected to measurement of printability, solderability and Al wire corrosion resistance, with the result that the percent defectives of the printability and the solderability were both 0%, and the percent defective for the Al wire corrosion after 500 hours were 82.7% (827/1000 ICs).

[EXAMPLES 2 TO 9 AND COMPARATIVE EXAMPLES 2,3]

In the same manner as in Example 1, compositions of the formulations indicated in Table 1 were prepared and used to check percent defectives for printability, solderability and Al wire corrosion. The Al wire corrosion was determined as a percent defective after 100 pieces of ICs were allowed to stand for 1000 hours.

The curability of the composition at 150° C. was also determined.

The results are shown in Table 1.

Al wire corrosion after standing for 1000 hours. The results are shown in Table 2.

TABLE 2

|  | Comparative Example 4 | Example 10 | Example 11 | Example 12 | Comparative Example 5 |
|---|---|---|---|---|---|
| dimethylpolysiloxane | 100 g | — | — | — | — |
| dimethylvinylpolysiloxane (formula (11)) | — | 95 g | 75 g | 50 g | — |
| dimethylhydrogenpolysiloxane (formula (12)) | — | 5 g | 25 g | 50 g | 100 g |
| Perbutyl C | — | 0.5 g | 0.5 g | 0.5 g | — |
| viscosity (centistokes) | 370 | 355 | 300 | 230 | 85 |
| Percent Defective: |  |  |  |  |  |
| printability | 0/1000 | 0/1000 | 0/1000 | 0/1000 | 5/1000 |
| soldability | 0/1000 | 0/1000 | 0/1000 | 0/1000 | 5/1000 |
| Al wire corrosion | 850/1000 | 0/1000 | 0/1000 | 0/1000 | 0/1000 |

The results of the Table 2 reveal that when the non-curable dimethylpolysiloxane is used singly (Comparative example 4), the percent defective of the Al wire corrosion of the ICs is high. The single use of the curable dimethylhydrogenpolysiloxane (Comparative Example 5) results in some percent defectives of the printability and solderability. The compositions of the invention containing two types of polysiloxanes and the peroxide (Examples 10 to 12) exhibit zero percent defectives with respect to the printability, solderability and Al wire corrosion.

[EXAMPLES 13 TO 16 AND COMPARATIVE EXAMPLE 6]

TABLE 1

|  | Example 2 | 3 | 4 | 5 | 6 | 7 | 8 | 9 | Comparative Example 2 | 3 |
|---|---|---|---|---|---|---|---|---|---|---|
| dimethylvinylpoly-siloxane (formula (11)) | 95 g | 95 g | 95 g | 95 g | 95 g | 95 g | 95 g | 95 g | 95 g | 95 g |
| dimethylhydrogenpoly-siloxane (formula (12)) | 5 g | 5 g | 5 g | 5 g | 5 g | 5 g | 5 g | 5 g | 5 g | 5 g |
| Perbutyl C | 0.3 g | 1.5 g | 5 g | 10 g | — | — | — | — | 0.1 g | 13 g |
| Percumyl D | — | — | — | — | 3 g | — | — | — | — | — |
| Perbutyl Z | — | — | — | — | — | 3 g | — | — | — | — |
| Perbutyl D | — | — | — | — | — | — | 3 g | — | — | — |
| Perhexa V | — | — | — | — | — | — | — | 3 g | — | — |
| viscosity (centistokes) | 110 | 100 | 70 | 50 | 75 | 75 | 75 | 75 | 115 | 45 |
| Percent Defective: |  |  |  |  |  |  |  |  |  |  |
| printability | 0/1000 | 0/1000 | 0/1000 | 0/1000 | 0/1000 | 0/1000 | 0/1000 | 0/1000 | 0/1000 | 0/1000 |
| soldability | 0/1000 | 0/1000 | 0/1000 | 0/1000 | 0/1000 | 0/1000 | 0/1000 | 0/1000 | 0/1000 | 0/1000 |
| Al wire corrosion | 0 | 0 | 0 | 3/100 | 0 | 0 | 0 | 2/100 | 5/100 | 25/100 |
| Curability: |  |  |  |  |  |  |  |  |  |  |
| 150° C., 0.5 hours | cured | cured | cured | cured | cured | cured | cured | cured | uncured | cured |
| 150° C., 1 hours | cured | cured | cured | cured | cured | cured | cured | cured | uncured | cured |
| 150° C., 3 hours | cured | cured | cured | cured | cured | cured | cured | cured | uncured | cured |
| 150° C., 10 hours | — | — | — | — | — | — | — | — | cured | — |
| 150° C., 16 hours | — | — | — | — | — | — | — | — | cured | — |

The results of Table 1 reveal that the composition comprising less than 0.1 part by weight of the peroxide per 100 parts by weight of the total of the polysiloxanes is poorer in curability and the composition comprising over 10 parts by weight of the peroxide is poorer in the Al wire corrosion. The compositions of the invention comprising from 0.1 to 10 parts by weight of the peroxides are better with respect to the printability, solderability and Al wire corrosion.

[EXAMPLES 10 TO 12 AND COMPARATIVE EXAMPLES 4,5]

In the same manner as in Example 1, compositions of the formulations indicated in Table 2 were prepared and used to determine the percent defectives of the printability and solderability and the percent defective of the Dimethylvinylpolysiloxane of the formula (11) having a viscosity of 100 centistokes with a Na+ content of 1 ppm and a Cl− content of 1 ppm, Si—H group-containing dimethylpolysiloxane of the formula (12) having a viscosity of 100 centistokes with a Na+ content of 1 ppm and a Cl− content of 1 ppm, and Perbutyl Z were used to obtain compositions indicated in Table 3. These compositions were used to check curability.

For comparison, 100 g of the above dimethylvinylpolysiloxane and 0.5 g of Perbutyl Z were mixed and agitated in a separable flask for 2 hours and passed through a millipore filter with a mesh size of 0.8 micrometers to obtain a composition (Comparative Example 6) for determination of curability.

The results are shown in Table 3 below.

TABLE 3

|  | Example 13 | Example 14 | Example 15 | Example 16 | Comparative Example 6 |
|---|---|---|---|---|---|
| dimethylvinylpoly-siloxane | 95 g | 95 g | 95 g | 95 g | 100 g |
| Si-H group-containing dimethylpolysiloxane | 5 g | 15 g | 30 g | 50 g | 0 g |
| Perbutyl Z | 0.5 g | 0.5 g | 0.5 g | 0.5 g | 0.5 g |
| viscosity (centistokes) | 350 | 115 | 80 | 20 | 370 |
| Curability |  |  |  |  |  |
| 150° C., 0.5 hours | uncured | cured | cured | cured | uncured |
| 150° C., 3 hours | cured | cured | cured | cured | uncured |
| 150° C., 5 hours | cured | cured | cured | cured | cured |
| 150° C., 10 hours | cured | cured | cured | cured | cured |
| 150° C., 15 hours | cured | cured | cured | cured | cured |

From the results of the Table 3, it will be found that the composition for comparison has a longer curing time and is thus poor in workability. The compositions of the invention comprising the three essential ingredients are shorter in curing time with better workability.

What is claimed is:

1. A method of filling the gaps or voids of an electronic part, which comprises:

impregnating said gaps or voids with a silicone composition consisting essentially of:

(A) a vinyl group-containing organopolysiloxane having at least two vinyl groups in one molecule represented by the following formula:

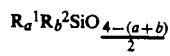

wherein $R^1$ denotes an unsubstituted or substituted monovalent hydrocarbon group having 1 to 10 carbon atoms, $R^2$ denotes an alkenyl group having 2 to 5 carbon atoms, $0 < a < 2$, $0 < b < 2$ and $1.8 \leq a+b \leq 2.2$, (B) an organohydrogenpolysiloxane having at least two hydrogen atoms bonded to silicon atoms in one molecule represented by the following formula:

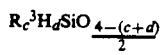

wherein $R^3$ has the same meaning as $R^1$ defined above, $0 < c < 2$, $0 < d < 3$ and $1 < c+d < 3$, said organohydrogenpolysiloxane being used in an amount of 5 to 100 parts by weight per 100 parts by weight of (A), and (C) a curing catalyst consisting of a peroxide compound selected from the group consisting of

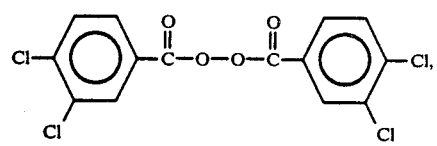

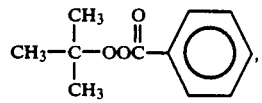

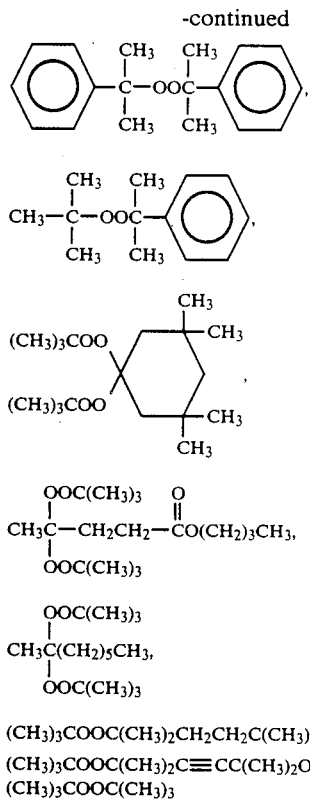

$(CH_3)_3COOC(CH_3)_2CH_2CH_2C(CH_3)_2OOC(CH_3)_3$, $(CH_3)_3COOC(CH_3)_2C\equiv CC(CH_3)_2OOC(CH_3)_3$ and $(CH_3)_3COOC(CH_3)_3$ said peroxide compound being present in an amount of from 0.1 to 10 parts by weight per 100 parts by weight of (A) and (B), said composition having a viscosity of from 20 to 400 centistokes at 25° C., and heating the impregnated electronic part at a temperature of from 150° to 180° C. for a period of from 1 to 4 hours.

2. The method according to claim 1, wherein said composition which enters the gaps or voids of the electronic part is not substantially brought in contact with oxygen in the air and when heated is cured; and said composition which is coated onto the outer surface of said electronic part is brought in contact with oxygen in the air when heated remains substantially uncured, since when said vinyl group-containing organopolysiloxanes are thermally cured by the use of a peroxide catalyst in air, the activity of the peroxide compound is suppressed by the presence of oxygen in the air, and thus the composition in contact with air, is rarely cured or hardened, whereas when no or little oxygen is present, the curing reaction can fully proceed and cured the composition.

3. The method according to claim 1, wherein (A) is comprised of an organopolysiloxane main chain with methyl and phenyl side groups attached thereto.

4. The method according to claim 1, wherein (A) has a viscosity of from 20 to 400 centistokes at 25° C.

5. The method according to claim 1, wherein (A) has a content of Na and Cl ions of not greater than 10 ppm.

6. The method according to claim 1, wherein (B) has a viscosity of from 1 to 500 centistokes at 25° C.

7. The method according to claim 1, wherein (B) has a content of Na and Cl ions of not greater than 10 ppm.

8. The method according to claim 1, wherein (C) has a content of Na and Cl ions of not greater than 100 ppm.

9. The method according to claim 1, wherein (A) is

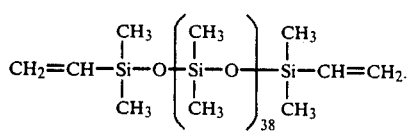

10. The method composition according to claim 1, wherein (B) is

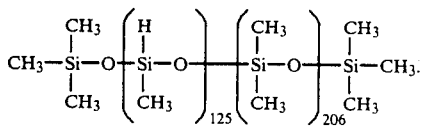

11. The method according to claim 1, wherein $R^1$ of the formula of (A) is an alkyl group, an aralkyl group or an aryl group.

* * * * *